United States Patent
Halpin

(10) Patent No.: US 6,856,078 B2
(45) Date of Patent: Feb. 15, 2005

(54) LAMP FILAMENT DESIGN

(75) Inventor: Michael W. Halpin, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 27 days.

(21) Appl. No.: 10/179,658

(22) Filed: Jun. 24, 2002

(65) Prior Publication Data

US 2003/0001475 A1 Jan. 2, 2003

Related U.S. Application Data

(60) Provisional application No. 60/301,339, filed on Jun. 27, 2001, and provisional application No. 60/370,099, filed on Apr. 3, 2002.

(51) Int. Cl.[7] .............................................. H01J 19/42
(52) U.S. Cl. ........................ 313/279; 313/271; 313/578
(58) Field of Search ................................. 313/271, 279, 313/578, 579

(56) References Cited

U.S. PATENT DOCUMENTS

| | | | |
|---|---|---|---|
| 3,942,063 A | * | 3/1976 | Winter et al. ............... 313/315 |
| 4,359,665 A | | 11/1982 | Morris et al. |
| 4,510,416 A | | 4/1985 | Meade et al. |
| 4,868,451 A | | 9/1989 | Fields et al. |
| 5,250,873 A | | 10/1993 | McHugh |
| 5,254,902 A | | 10/1993 | Griffin et al. |
| 5,808,399 A | | 9/1998 | Yoneyama |

FOREIGN PATENT DOCUMENTS

| | | |
|---|---|---|
| EP | 0 255 638 | 7/1987 |
| EP | 0 434 373 A2 | 6/1991 |
| EP | 0 438 254 A2 | 7/1991 |
| EP | 1 045 429 A1 | 3/2000 |
| GB | 1 505 749 | 3/1978 |
| JP | 51-46785 (2) | 4/1976 |
| JP | 59-16260 | 1/1984 |
| JP | 60-47366 | 3/1985 |
| JP | 6-020659 | 1/1994 |
| JP | 2002-367568 | 12/2002 |

* cited by examiner

*Primary Examiner*—Joseph Williams
(74) *Attorney, Agent, or Firm*—Knobbe, Martens, Olson & Bear LLP.

(57) ABSTRACT

An improved support is provided for locating a lamp filament axially within a lamp sleeve. The illustrated support is a spiral coil that includes a small diameter center portion that makes contact with the filament. On either side of the filament-contacting portion, the coil opens up to larger diameters for contacting the inner wall of the quartz sleeve within which the filament is housed. The support thus appears H-shaped when viewed from the side. A lamp filament is also provided with expansion compensation sections at either end of a central section. The filament wire in the compensation sections is wound into coils having a greater diameter and also a greater spacing between windings, as compared to coil in the central section. The expansion compensation sections are preferably capable of compressing and thereby absorbing thermal expansion of the filament during operation, without shorting the filament across adjacent windings.

31 Claims, 8 Drawing Sheets

LAMP FILAMENT DESIGN

REFERENCE TO RELATED APPLICATION

The present application claims priority under 35 U.S.C. §119(e) to U.S. provisional patent application No. 60/301,339, filed Jun. 27, 2001 and to U.S. provisional patent application No. 60/370,099 filed Apr. 3, 2002.

FIELD OF THE INVENTION

The invention relates to lamp filaments generally and, more particularly, to improving support and design of filaments for high energy, radiantly heated semiconductor processing reactors.

BACKGROUND OF THE INVENTION

Chemical vapor deposition (CVD) is a very well known process in the semiconductor industry for forming thin films of materials on substrates and silicon wafers. In a CVD process, gaseous molecules of the material to be deposited are supplied to wafers to form a thin film of that material on wafers by chemical reaction. Such formed thin films may be polycrystalline, amorphous or epitaxial. Typically, CVD processes are conducted at elevated temperatures to accelerate a chemical reaction and to produce high quality films. Some processes, such as epitaxial silicon deposition, are conducted at extremely high temperatures (>900° C.).

Substrates (e.g., silicon wafers) can be heated using resistance heating, induction heating or radiant heating. Among these, radiant heating is the most efficient technique and, hence, is the currently favored method for certain types of CVD. Radiant heating involves positioning infrared lamps within high-temperature ovens, called reactors. Typically these lamps comprise metal filaments within a quartz or other transparent sleeve. A quartz wall also separates the reaction chamber from the lamps. A susceptor within the reaction chamber typically supports a single substrate and also absorbs the radiant energy to help uniformly heat the wafer.

One arrangement of a radiantly heated reactor is shown in U.S. Pat. No. 4,975,561, issued Dec. 4, 1990 to Robinson et al., the disclosure of which is incorporated herein by reference. In that disclosure, linear infrared lamps are arranged in a pair of crossing arrays, with one orientation above the lamps and an orthogonal orientation below the susceptor. The grid resulting from the crossing array configuration facilitates some control over the temperature uniformity of the wafer by adjusting the power that is delivered to any particular lamp or group of lamps. Additional spot lamps are also employed in the disclosed system of the '561 patent.

During a CVD process, one or more substrates are placed on a wafer support inside a chamber formed within the reactor (i.e., the reaction chamber). Both the wafer and the support are radiantly heated to a desired temperature, while the radiant energy passes through the quartz sleeve and quartz chamber walls such that they remain relatively cool. Accordingly, the reactor is called a "cold-wall" reactor. Only the wafer (and some supporting elements like the susceptor) are heated to the temperature sufficient to activate the reaction gases. In a typical wafer treatment step, reactant gases are passed over the heated wafer, causing the chemical vapor deposition (CVD) of a thin layer of the desired material on the wafer.

Radiant heat can likewise be employed for any of a number of other processes in semiconductor fabrication, including, without limitation, etching, dopant diffusion, dopant activation, oxidation, nitridation, silicidation, reorientation anneals, oxide or metal reflow, etc. Furthermore, the heating system of the '561 patent is exemplary only; many other radiant heating systems are known in the art.

One problem with currently available radiant heating elements is that the lifespan of the lamps is short, causing significant downtime for frequent replacement. Extended use of such lamps, typically including repeated cycling as wafers are sequentially loaded, processed at high temperature and unloaded, leads to lamp failure.

Accordingly, a need exists for a system for improving lamp lifespan.

SUMMARY OF THE INVENTION

In accordance with one aspect of the invention, a lamp filament support is provided with a filament-contacting portion and at least two sleeve-contacting portions. In the illustrated embodiment, the filament-contacting portion is provided between two sleeve-contacting portions, resembling an H-shaped element in side view.

In accordance with another aspect of the invention, a lamp filament is provided with expansion compensation sections at either end of the central section. The compensation sections have a greater diameter about the filament axis, as compared to the central section, and also have greater spacing between windings. The compensation sections are preferably capable of compressing and absorbing thermal expansion of the filament during operation, without shorting the filament across adjacent windings.

BRIEF DESCRIPTION OF THE DRAWINGS

These and other aspects of the invention will be readily apparent from the description below and the appended drawings, in which like reference numerals refer to similar parts throughout, which are meant to illustrate and not to limit the invention, and in which.

DETAILED DESCRIPTION OF THE PREFERRED EMBODIMENTS

Figure 6:
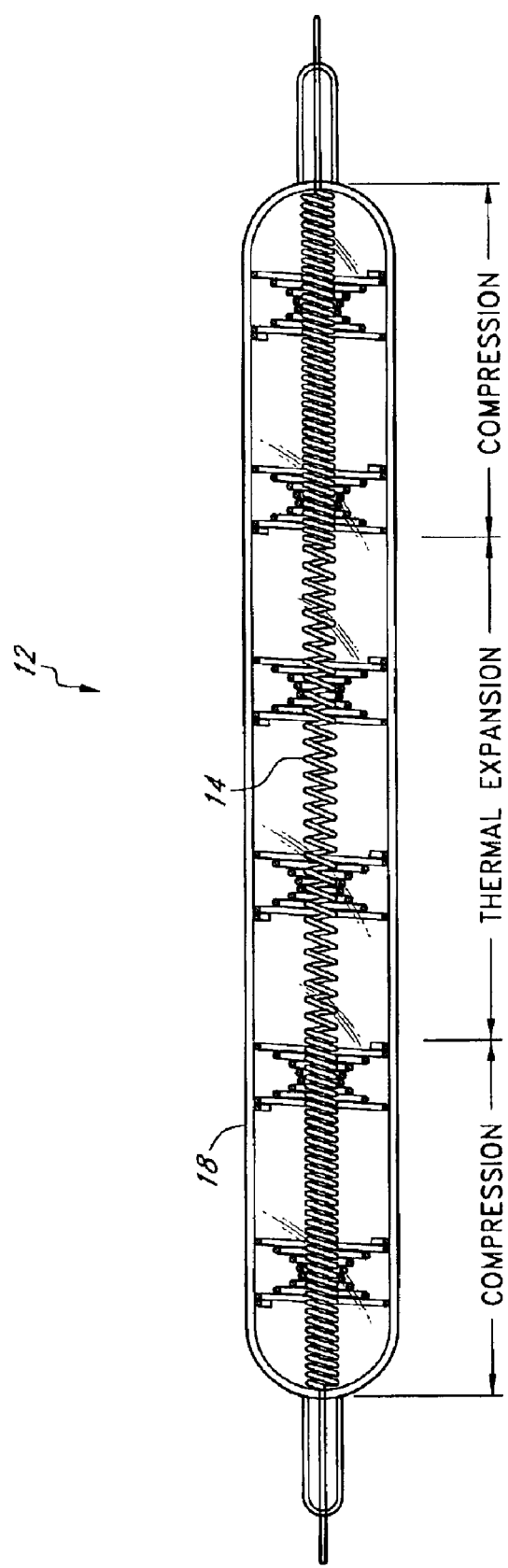
FIG. 6 is a schematic side view of a lamp, for purposes of illustrating the effect of thermal expansion upon the lamp filament.
Figure 7:
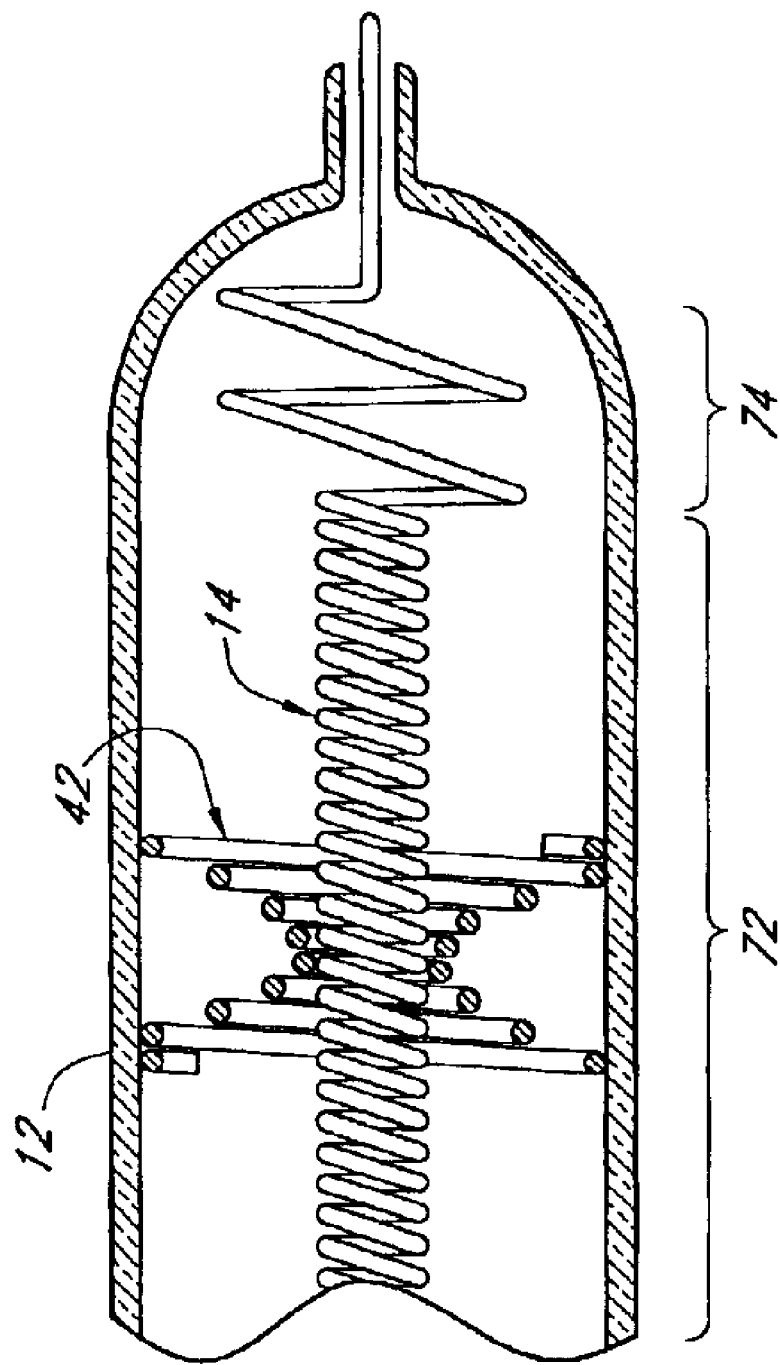
FIG. 7 is a schematic side view of one end of a lamp provided with thermal compensation sections, in accordance with another embodiment of the present invention.
Figure 8:
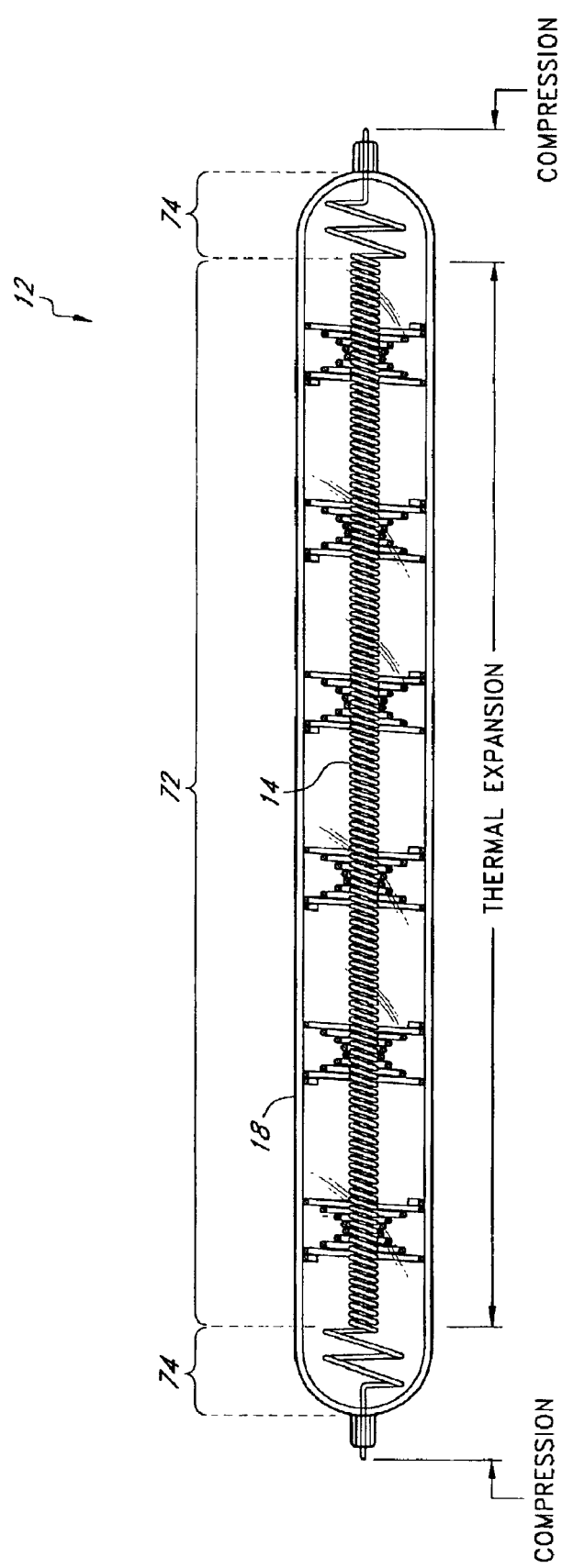
FIG. 8 is a schematic side view of a lamp employing thermal expansion compensation sections at both ends, for purposes of illustrating the operation of the preferred embodiment.

FIGS. 1–5 illustrate sections of lamps for purposes of describing problems and solutions with respect to filament support. FIGS. 6–8 illustrate lamps for purposes of describing problems and solutions with respect to filament expansion and contraction.

The material of a lamp filament used in radiant heating applications is typically tungsten wire, which does not maintain its stiffness at high temperatures. Conventionally, additional spiral support wires, each having a spiral or conical shape, are added around the filament periodically along the filament length to help support the filament, as shown in FIGS. 1–3.

Figure 1:
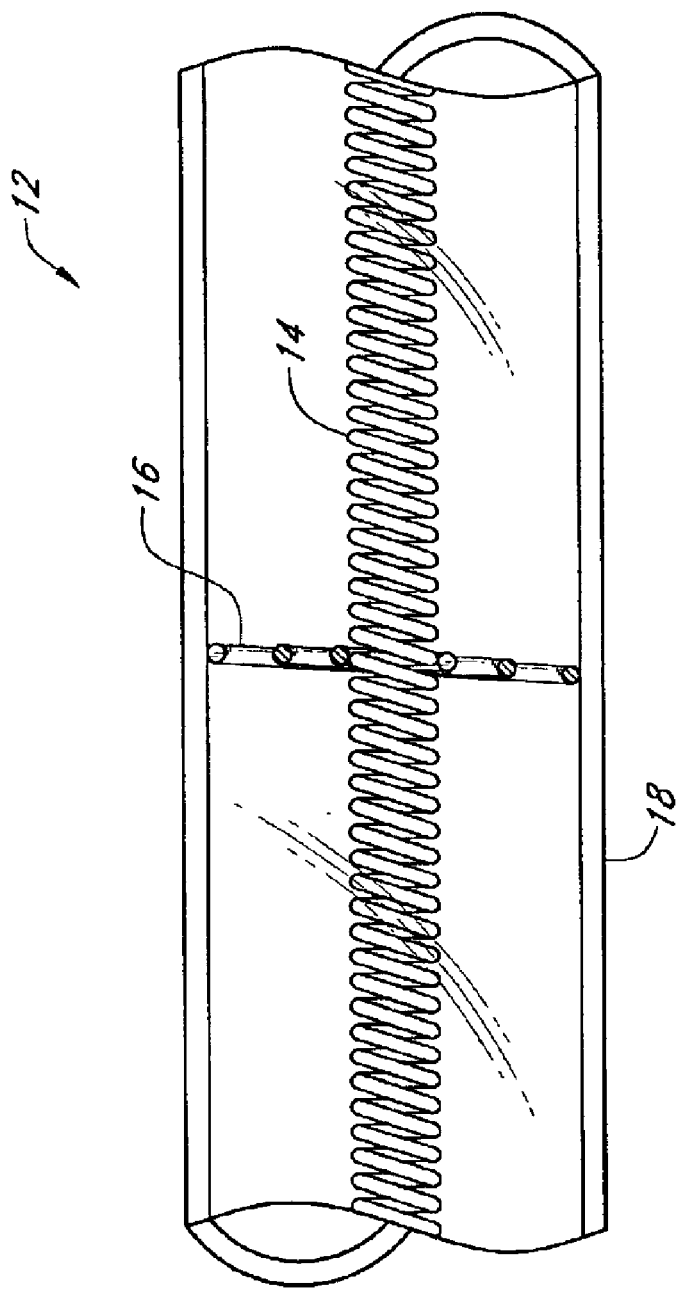
FIG. 1 is a side view of a typical lamp with a conventional filament support.

FIG. 1 depicts a quartz lamp 12 as might be typically found in a reactor. The quartz lamp 12 comprises a filament 14, spiral filament support 16 and quartz sleeve 18. The support 16 contacts the filament 14 at an inner part of its spiral, and buttresses against the quartz sleeve 18 at an outer part of the spiral. Thus, the support 16 is intended to hold the filament 14 away from the quartz sleeve 18 of the lamp 12. Unfortunately, this support has been found to tip under operation.

Figure 2:
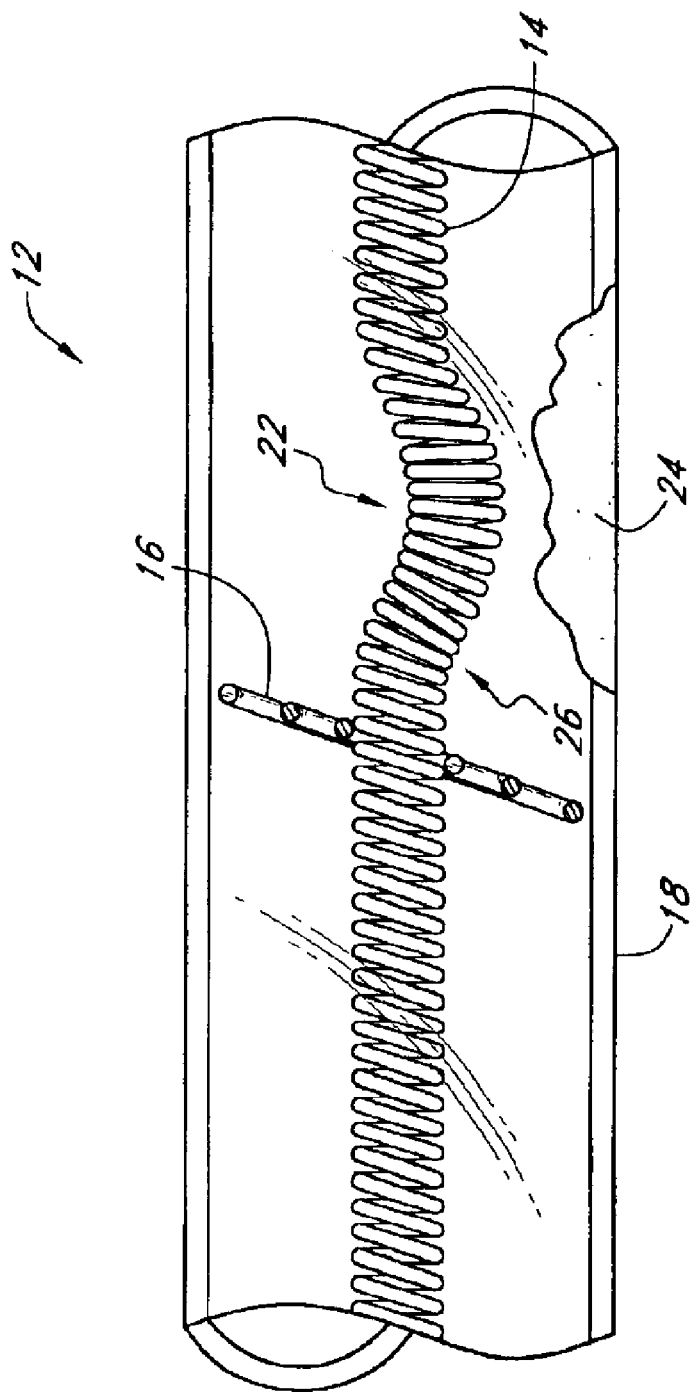
FIG. 2 is a side view of a typical lamp illustrating the problem of shorting caused by rotation of the support and sagging of the filament.
Figure 3:
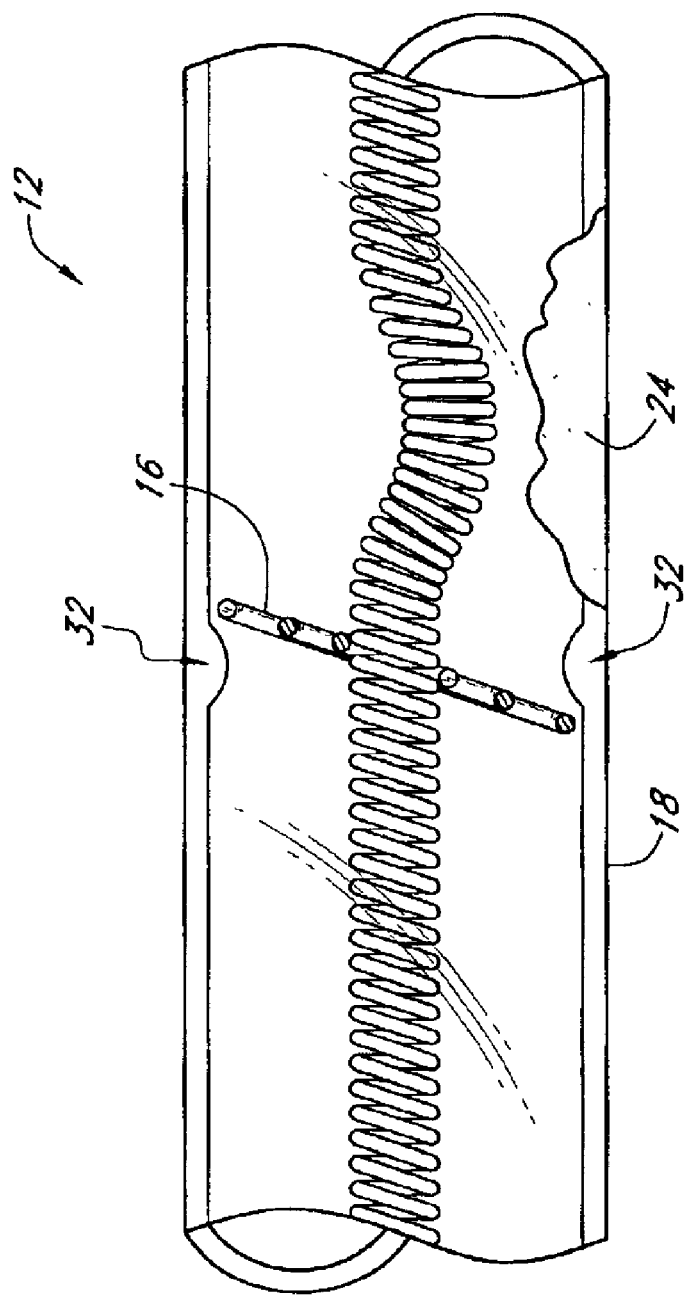
FIG. 3 is a side view of a filament support used in conjunction with a dimpled lamp sleeve.

FIG. 2 is a side view of a typical lamp 12 illustrating the problem of shorting caused by rotation of the support 16 and sagging of the filament 14. As electricity passes through the resistive filament 14, it begins to glow, and generate heat and light. As the filament 14 nears the melting point of the material of which it is made, the hot filament 14 begins to sag under gravity. This sagging creates a moment load that tends to tip or rotate the support 16, such that it no longer functions to hold up the filament 14. As the filament 14 sags, adjacent coils of the filament 14 grow closer together on the inside curves of the deformed filament 14, and eventually create electrical shorts 22, 26 along the filament. These shorts 22, 26 in turn allow increased electricity to flow through the filament 14, causing its temperature to increase, and exacerbating the filament sagging problem. Eventually, as the filament 14 nears the quartz sleeve 18, the heat generated by the filament begins to blister or melt the quartz, creating a deformation, blister or hole 24. At this point, the integrity of the lamp 12 is compromised, and it typically fails.

One proposed solution to this problem has been to "trap" the filament support 16 by providing dimples 32 in the inner quartz surface into which the support extends, making it more difficult for the support to rotate out of position. As shown in FIG. 3, however, the support 16 still tends to rotate, even with the dimples 32. Furthermore, the dimples 32 are costly to introduce onto the otherwise smooth quartz sleeve 18, and also tend to obscure the otherwise clear quartz, possibly affecting radiant heat transmission as well as visual inspection of the lamp 12.

Figure 4:
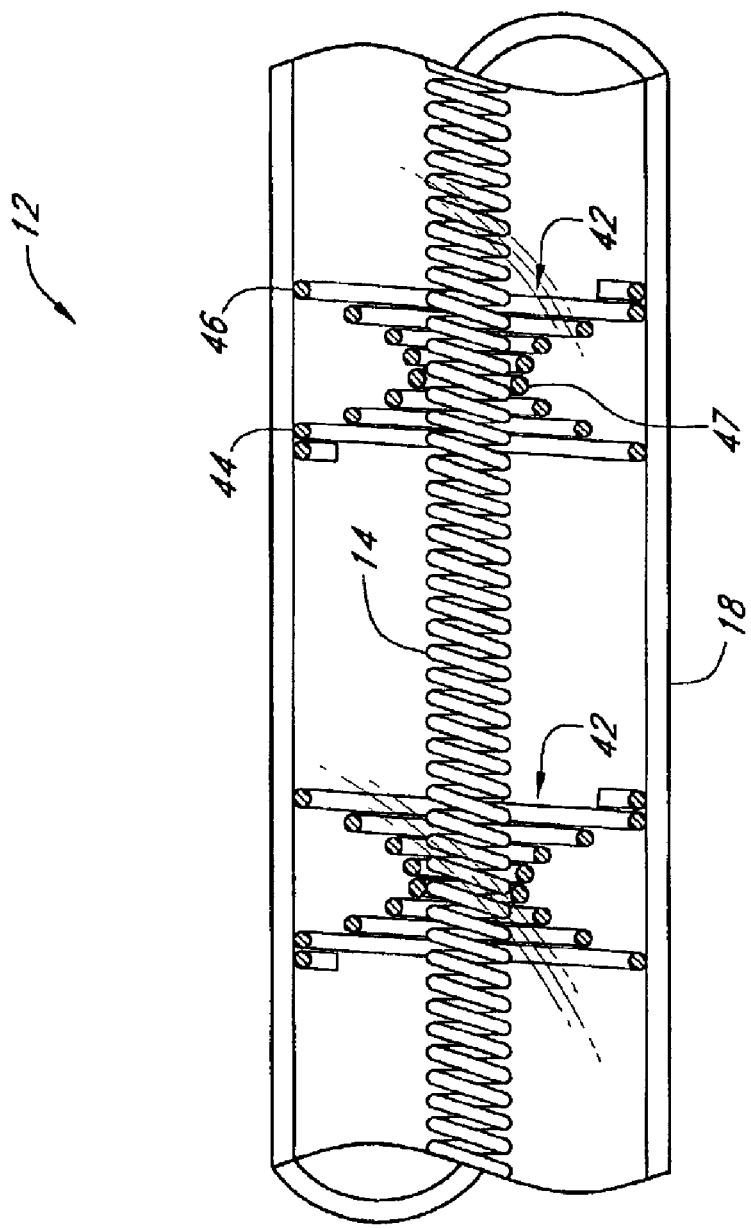
FIG. 4 is an enlarged view showing two supports which hold a filament away from a lamp tube wall, constructed in accordance with a preferred embodiment of the present invention

As shown in FIG. 4, a support 42 constructed in accordance with a preferred embodiment of the present invention includes a plurality of contact portions laterally spaced from one another. In the illustrated embodiment, each support 42 comprises two conical spirals, joined at their apexes. The support 42 comprises one large diameter ring at either end, which contacts the quartz sleeve at two sleeve-contacting portions 44 and 46, and a series of smaller diameter rings which support the filament 14 at a filament-contacting portion 47. In the side view of FIG. 4, the support 42 resembles the letter "H." However, one skilled in the art will understand that numerous embodiments may be employed. For example, a support resembling the letter "X" in the side view may also be used.

The preferred support 42 comprises tungsten wire having about the same thickness (e.g., within about ±50% of the thickness) as the filament 14. While the radially-inward filament-contacting portion 47 of the support 42 may get hot during operation, the radially-outward sleeve-contacting portions 44, 46 tend to be cool enough to avoid damage to the quartz sleeve 18. It will be understood, however, that other materials can also be employed in the construction of the support 42.

As the filament 14 nears the melting point of the material of which it is made, the hot filament 14 begins to sag under gravity. As shown in FIGS. 1–3, in the prior art, this sagging creates a moment load that tends to tip or rotate the support 16, such that it no longer functions to hold up the filament 14. However, in the preferred embodiment, the improved support 42 does not tip or rotate under the moment. Advantageously, this prevents the filament from excessive sagging, thereby avoiding shorting and melting the quartz sleeve 18, and consequently extending the working life of the lamp 12.

In the preferred embodiment, the lamp 12 is designed to allow for CVD or other processes typically conducted within a reactor. In particular, the filament 14 preferably has a 1 kW capacity, more preferably a 3 kW capacity, even more preferably a 6 kW capacity and most preferably a 10 kW capacity. In addition, the reactor (not shown) is preferably capable of achieving a temperature greater than about 500° C., more preferably greater than about 700° C. and most preferably greater than about 900° C.

Figure 5:
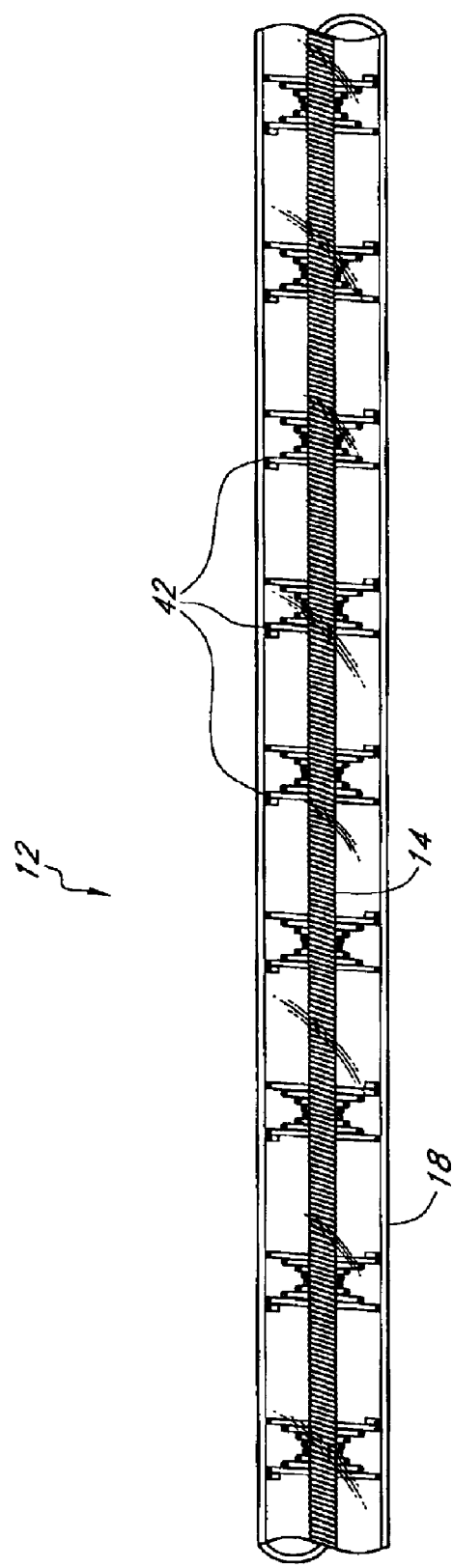
FIG. 5 is a side view of a tubular lamp having a plurality of supports, constructed in accordance with a preferred embodiment of the present invention.

Referring now to FIG. 5, a lamp 12 is shown with a plurality of filament supports 42 constructed in accordance with a preferred embodiment of the present invention. The supports 42 are spaced along the filament 14, thereby holding it within and away from the quartz sleeve 18.

FIG. 6 depicts a schematic side view of a lamp 12, illustrating the effect of thermal expansion upon the lamp filament 14. Conventionally, the filament 14 is rigidly connected to electrode contacts at the lateral ends of the lamp 12. When the lamp 12 is turned on, the filament 14 becomes very hot and expands in accordance with its coefficient of thermal expansion (CTE). As the filament 14 heats up, it tends to expand the most in its center portion, marked "thermal expansion" in FIG. 6. The rigid connections at the lateral ends of the filament 14 cause expansion to be absorbed between the closely spaced filament coils and either end of the filament 14. In particular, the closely spaced coils within the lateral end zones, marked "compression" in FIG. 6, can become close enough to short out, as described above with respect to FIG. 3. The shorted coils then exhibit lower resistance and larger current travels through the filament 14, leading to increased heat and further filament 14 expansion. When the power to the filament 14 is switched off, the filament 14 cools in place and without commensurate contraction. Consequently, through repeated heating and cooling cycles the problem is exacerbated until the filament 14 melts and the lamp 12 fails.

FIG. 7 is a schematic side view of an improved lamp 12 provided with a thermal compensation section of the filament 14, in accordance with another embodiment of the present invention. While illustrated with the novel H-shaped supports 42 described above, it will be understood that the description of FIGS. 7 and 8 is applicable to filaments supported by any of a variety of mechanisms.

The lamp 12 includes a filament 14 supported within a transparent sleeve, preferably comprising quartz. The filament 14 comprises a wire formed of suitable material, and comprises tungsten in the illustrated embodiment. In a central portion 72 of the filament 14, the wire is densely coiled. This dense coiling causes the filament 14 to heat up and expand in the central section 72. At either end of the filament 14 is an expansion compensation section 74. These expansion compensation sections 74 are configured to serve as "springs" in the sense that they compress more readily without shorting, as compared to the central section 72 of the filament 14.

In particular, the expansion compensation sections 74 preferably are formed by coils having a larger diameter and larger spacing (increased pitch) as compared to the central section 72 of the filament 14. Preferably, the diameter of the expansion compensation sections 74 is greater than about 1.5 times, and more preferably greater than about 2.0 times, that of the coil in the central section 72 of the filament 14. Furthermore, the spacing between windings in the expansion compensation section 74 is preferably greater than about 1.5 times, and more preferably greater than about 2.0 times, that of the coil in the central section 72 of the filament 14. In an exemplary lamp, the central section 72 has a coil diameter of about 3 mm to 4 mm and coil spacing of about 0.2 mm; however, the skilled artisan can readily apply the teachings herein to filaments of other dimensions. As best seen from FIG. 8, the length of the expansion compensation section 74, as measured along the filament axis, is small compared to the length of the central section 72, preferably representing less than about one tenth of the central section 72, but each expansion compensation section 74 preferably includes at least 2.5 turns or windings.

The illustrated expansion compensation section 74 comprises integral coils formed from the same wire as the main heater coils in the central section 72 of the filament 14. Advantageously, no additional parts are required to implement the expansion sections 74; the formation of windings is simply adapted to include coils of a larger diameter and lower pitch (greater spacing) at the lateral ends of the filament 14. The skilled artisan will readily appreciate in view of the present disclosure, however, that similar functionality can be obtained with separately formed elements bonded to either end of the filament 14. Furthermore, such elements need not necessarily comprise coils but can comprise other devices capable of readily compressing in response to thermal expansion of the filament 14, and also capable of carrying current to the filament 14. Other examples of expansion compensation devices include leaf springs, memory metals in readily compressible configurations, etc.

FIG. 8 illustrates the operation of the preferred embodiment in accordance with the present invention. As current passes through the filament 14, the central portion 72 of the filament 14 expands (marked "thermal expansion" in FIG. 8). Preferably, as measured lengthwise, the central portion 72 comprises at least 70% of the filament 14, more preferably, 80% of the filament 14, and most preferably, 90% of the filament 14. The expansion of the filament 14 causes the expansion compensation sections 74 on either end of the filament 14 to be compressed, as is illustrated in the section marked "compression." Advantageously, the expansion compensation sections 74 allow the filament 14 to expand while heating, and contract while cooling, thereby allowing the filament 14 to retain its original shape. Preferably, after repeated cycling (at least 2,000 cycles), the filament returns to less than 101.5% of its original length, more preferably, 101% of its original length, and most preferably, 100.5% of its original length. Advantageously, the coils of the filament are prevented from shorting, and lamp life is increased.

It will be appreciated by those skilled in the art that various modifications and changes may be made without departing from the scope of the invention. Such modifications and changes are intended to fall within the scope of the invention, as defined by the appended claims.

I claim:

1. A lamp having a filament support with at least two supporting portions connected to one another, wherein the filament support comprises two conical spirals joined at their apexes.

2. The lamp of claim 1, wherein the lamp comprises a transparent sleeve, a filament, and the filament support arranged to space the filament from the transparent sleeve.

3. The lamp of claim 2, wherein the filament support comprises two end portions sized to closely conform to an inner surface of the transparent sleeve and a smaller inner portion sized to closely conform to an outer surface of the filament.

4. The lamp of claim 3, wherein the filament comprises a wire coil and the inner portion of the filament support closely conforms to the outer surface of the coiled wire.

5. The lamp of claim 3, wherein the filament support resembles the letter "H" when viewed from the side.

6. The lamp of claim 3, wherein the filament support resembles the letter "X" when viewed from the side.

7. The lamp of claim 3, wherein the filament is suspended between a pair of expansion compensation sections proximate lateral ends of the filament, the expansion compensation sections being more readily compressible than the coil of the central section without shorting.

8. The lamp of claim 3, having a maximum capacity of greater than about 1 kW.

9. The lamp of claim 8, having a maximum capacity of greater than about 3 kW.

10. The lamp of claim 9, having a maximum capacity of greater than about 6 kW.

11. The lamp of claim 9 having a maximum capacity of greater than about 10 kW.

12. A lamp for a semiconductor processing apparatus, the lamp comprising a filament housed within a transparent sleeve, the filament comprising a central section formed by a wire coil and a pair of expansion compensation sections proximate lateral ends of the filament, the expansion compensation sections being more readily compressible than the coil of the central section without shorting and wherein each compensation section comprises a coil having a larger diameter than the coil of the central section.

13. The lamp of claim 12, wherein the expansion compensation sections each comprise a coil having a larger spacing than the coil of the central section.

14. A lamp for a semiconductor processing apparatus, the lame comprising a filament housed within a transparent sleeve, the filament comprising a central section formed by a wire coil and a pair of expansion compensation sections proximate lateral ends of the filament, the expansion compensation sections being more readily compressible than the coil of the central section without shorting and wherein the expansion compensation sections each comprise a coil having a larger spacing than the coil of the central section, wherein the coil of each of the expansion compensation sections has a diameter greater than about 1.5 times a diameter of the coil of the central section.

15. The lamp of claim 14, wherein the coil of each of the expansion compensation sections has a diameter greater than about 2 times a diameter of the coil of the central section.

16. A lamp for a semiconductor processing apparatus, the lamp comprising a filament housed within a transparent sleeve, the filament comprising a central section formed by a wire coil and a pair of expansion compensation sections proximate lateral ends of the filament, the expansion compensation sections being more readily compressible than the coil of the central section without shorting and wherein the expansion compensation sections each comprise a coil having a larger spacing than the coil of the central section wherein the coil of each of the expansion compensation sections has a spacing between windings greater than about 1.5 times a spacing between windings of the coil of the central section.

17. The lamp of claim 16, wherein the coil of each of the expansion compensation sections has a spacing between windings greater than about 2 times a spacing between windings of the coil of the central section.

18. The lamp of claim 13, wherein the coils of expansion compensation sections and the central section are formed from an integral metal wire.

19. A lamp for a semiconductor processing apparatus, the lamp comprising a filament housed within a transparent sleeve, the filament comprising a central section formed by a wire coil and a pair of expansion compensation sections proximate lateral ends of the filament, the expansion compensation sections being more readily compressible than the coil of the central section without shorting and wherein the expansion compensation sections each comprise a coil having a larger spacing than the coil of the central section, wherein each of the expansion compensation sections has a length less than one tenth a length of the central section, as measured along a filament axis.

20. The lamp of claim 19, wherein each of the expansion compensation sections includes at least 2.5 coil windings.

21. The lamp of claim 14 further comprising a filament support with at least two supporting portions connected to one another and arranged to space the filament from the transparent sleeve.

22. The lamp of claim 21, wherein the filament support comprises two end portions sized to closely conform to an inner surface of the transparent sleeve and a smaller inner portion sized to closely conform to an outer surface of the filament.

23. The lamp of claim 22, wherein the filament comprises a wire coil and the inner portion of the filament support closely conforms to the outer surface of the coiled wire.

24. The lamp of claim 23, wherein the filament support comprises two conical spirals, joined at their apexes.

25. The lamp of claim 12, capable of heating objects inside the semiconductor processing apparatus to temperatures greater than about 500° C.

26. The lamp of claim 25, capable of heating objects inside the semiconductor processing apparatus to temperatures greater than about 700° C.

27. The lamp of claim 26, capable of heating objects inside the semiconductor processing apparatus to temperatures greater than about 900° C.

28. The lamp of claim 12, having a maximum capacity of greater than about 1 kW.

29. The lamp of claim 28, having a maximum capacity of greater than about 3 kW.

30. The lamp of claim 29, having a maximum capacity of greater than about 6 kW.

31. The lamp of claim 29, having a maximum capacity of greater than about 10 kW.

* * * * *